US00RE49475E

(19) United States
(12) Reissued Patent
Bjormander

(10) Patent Number: US RE49,475 E
(45) Date of Reissued Patent: Mar. 28, 2023

(54) COATED CUTTING TOOL

(71) Applicant: SANDVIK INTELLECTUAL PROPERTY AB, Sandviken (SE)

(72) Inventor: Carl Bjormander, Spanga (SE)

(73) Assignee: SANDVIK INTELLECTUAL PROPERTY AB, Sandviken (SE)

(21) Appl. No.: 16/863,739

(22) Filed: Apr. 30, 2020

Related U.S. Patent Documents

Reissue of:
(64) Patent No.: 9,956,667
Issued: May 1, 2018
Appl. No.: 14/897,762
PCT Filed: Jun. 13, 2014
PCT No.: PCT/EP2014/062351
§ 371 (c)(1),
(2) Date: Dec. 11, 2015
PCT Pub. No.: WO2014/198881
PCT Pub. Date: Dec. 18, 2014

(30) Foreign Application Priority Data

Jun. 14, 2013 (EP) ..... 13172154

(51) Int. Cl.
*B24D 3/34* (2006.01)
*C23C 16/36* (2006.01)
*C23C 30/00* (2006.01)
*B23B 27/14* (2006.01)

(52) U.S. Cl.
CPC ..... *B24D 3/34* (2013.01); *C23C 16/36* (2013.01); *C23C 30/005* (2013.01)

(58) Field of Classification Search
CPC ..... B24D 3/34; C23C 16/36; C23C 30/005
See application file for complete search history.

(56) References Cited

U.S. PATENT DOCUMENTS 5,945,207 A * 8/1999 Kutscher ..... C23C 16/30 428/701
7,192,660 B2 * 3/2007 Ruppi ..... C23C 16/36 428/325
7,232,603 B2 * 6/2007 Hessman ..... C23C 16/30 428/698
2010/0232893 A1 * 9/2010 Imamura ..... C23C 16/36 407/119

(Continued)

FOREIGN PATENT DOCUMENTS

EP 1897970 A1 3/2008
EP 2570510 * 3/2013
EP 2604720 A1 6/2013

(Continued)

OTHER PUBLICATIONS

M'Saoubi R et al. "Wear and thermal behaviour of CVD alpha-AI203 and MTCVD Ti(C,N) coatings during machining", CIRP Annals, vol. 58, pp. 57-60, (2009).

(Continued)

*Primary Examiner* — Sean E Vincent
(74) *Attorney, Agent, or Firm* — Corinne R. Gorski

(57) ABSTRACT

A coated cutting tool having a substrate and a surface coating, wherein the coating includes a Ti(C,N) layer of at least one columnar fine-grained MTCVD Ti(C,N) layer with an average grain width of 0.05-0.2 μm and an atomic ratio of carbon to the sum of carbon and nitrogen (C/(C+N)) contained in the MTCVD Ti(C,N) layer is in average 0.50-0.65.

16 Claims, 4 Drawing Sheets

(56) References Cited

U.S. PATENT DOCUMENTS

| | | | | |
|---|---|---|---|---|
| 2012/0225247 | A1* | 9/2012 | Sone | C23C 16/34 428/336 |
| 2014/0308083 | A1* | 10/2014 | Bjormander | C23C 16/36 407/119 |

FOREIGN PATENT DOCUMENTS

| | | | |
|---|---|---|---|
| JP | H08155724 | A | 6/1996 |
| JP | 11-131235 | * | 5/1999 |
| JP | 2008087150 | A | 4/2008 |
| WO | 2013/037997 | * | 3/2013 |

OTHER PUBLICATIONS

Larsson et al. "Microstructure and properties of Ti)C,N) coatings produced by moderate temperature chemical vapour deposition", Thin Solid Films, vol. 402, pp. 203-210 (2002).

* cited by examiner

COATED CUTTING TOOL

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

RELATED APPLICATION DATA

This application is a *reissue of U.S. Pat. No. 9,956,667, filed Dec. 11, 2015, which claims the benefit of* § 371 National Stage Application of PCT International Application No. PCT/EP/062351 filed Jun. 13, 2014 claiming priority of EP Application No. 13172154.0, filed Jun. 14, 2013.

TECHNICAL FIELD

The present invention relates to a coated cutting tool for chip forming machining of metals comprising a substrate having a surface coated with a chemical vapor deposition (CVD). In particular the present invention relates to a coated cutting tool having a CVD coating comprising at least one fine-grained titanium carbonitride.

BACKGROUND

Cutting tools for chip forming machining of metals, such as round tools, i.e. end mills, drills, etc., and inserts, made of durable materials, such as cemented carbide, cermet, cubic boronitride or high speed steel, commonly have a wear resistant coating to prolong service life of the cutting tool. The wear resistant coatings are frequently coated using CVD since this technique has several advantages. It enables large throughput in production of the cutting tools, conformal coating on complex geometries and can readily be used to deposit insulating coating layers such as alumina.

In particular, cemented carbide cutting tools for turning are usually coated with CVD coatings comprising a layered structure of different materials to provide sufficient wear resistance, where composition, microstructure, texture etc. of the individual layers are chosen to improve certain properties of the coating for a specific application. The predominant coating used today comprises a Ti-based layer, hereinafter referred to as Ti(C,N,O) layer comprising one or more layers selected from titanium carbide, titanium nitride, titanium carbonitride, titanium oxycarbide and titanium oxycarbonitride, hereinafter referred to as TiC, TiN, Ti(C,N), Ti(C,O), Ti(C,N,O) layers, deposited on a surface of the substrate and an alumina layer, hereinafter referred to as $Al_2O_3$ layer, deposited on the Ti(C,N,O) layer. Moderate temperature CVD (MTCVD) processes has proven to be advantageous for deposition of Ti(C,N) layers as compared to high temperature CVD (HTCVD) processes.

Larsson and Ruppi, Thin Solid Films 402 (2002) 203-210 discloses a study on the microstructure and properties of Ti(C,N) coatings deposited on cutting tool substrates using MTCVD, as compared with Ti(C,N) coatings deposited using HTCVD. The HTCVD Ti(C,N) coating exhibits equiaxed grains without preferred growth direction and an average grain size of less than 0.2 μm. In contrast the MTCVD Ti(C,N) coatings exhibit a relatively large TC(422) value in X-ray diffraction measurement, hereinafter referred to as a (422) texture, and columnar grains having a width of about 0.5 μm. The difference in microstructure is assigned to the lower temperature and aggressive precursors, such as acetonitrile ($CH_3CN$). The MTCVD Ti(C,N) coating has better edge chipping resistance, but worse crater wear resistance, as compared to the HTCVD Ti(C,N) coating. However, flaking resistance still is critical for MTCVD Ti(C,N) coatings, in particular in demanding applications such as turning in nodular cast iron comprising intermittent cutting operations.

EP 1 897 970 A1 discloses a columnar Ti(C,N) layer with a (422) texture deposited using a MTCVD process with precursors comprising acetonitrile, titanium tetrachloride, nitrogen and hydrogen, and in addition a hydrocarbon such as $C_2H_4$ or $C_3H_6$, which is disclosed to give high atomic ratio of carbon to the sum of carbon and nitrogen (C/C+N) contained in the columnar Ti(C,N) layer, i.e. at least 0.70, and thus a high hardness and improved wear resistance as compared to a standard acetonitrile process in accordance with above. The columnar Ti(C,N) layer formed using these precursors is fine-grained with an average grain width of 0.05 to 0.5 μm and has a high fracture resistance. Albeit the improved hardness the oxidation resistance of this columnar Ti(C,N) layer may be insufficient, in particular for cutting operations generating a lot of heat in the coating.

SUMMARY

It is an object of the present invention to provide a coated cutting tool with improved properties in cutting operations. It is a further object of the invention to provide a coated cutting tool with improved wear resistance, for example a higher resistance to flaking. Another object of the invention is to provide a cutting tool with high performance in milling of grey cast iron and nodular cast iron.

These objects are achieved by a cutting tool according to claim 1. Preferred embodiments are disclosed in the dependent claims.

The present invention relates to a coated cutting tool comprising a substrate and a coating, wherein said coating comprises a Ti(C,N) layer comprising at least one columnar MTCVD Ti(C,N) layer with an average grain width of 0.05-0.5 μm, preferably 0.05-0.4 μm, more preferably 0.05-0.25 μm, most preferably 0.1-0.2 μm, measured on a cross section with a surface normal perpendicular to a surface normal of the substrate, on a rake face of the coated cutting tool, along a straight line in a direction parallel to a surface of the substrate, at a centered position between a lowermost and an uppermost interface of said MTCVD Ti(C,N) layer. The atomic ratio of carbon to the sum of carbon and nitrogen (C/(C+N)) contained in said MTCVD Ti(C,N) layer is 0.50-0.65, preferably 0.52-0.60, more preferably 0.54-0.56, when measured for example by electron microprobe analysis using a electron microprobe at 10 positions spaced 50 μm along said straight line. Said MTCVD Ti(C,N) layer exhibits an X-ray diffraction pattern, as measured using CuKα radiation, wherein the texture coefficients TC(hkl) are defined as $$TC(hkl) = \frac{I(hkl)}{I_0(hkl)}\left[\frac{1}{n}\sum_{n=1}^{n}\frac{I(hkl)}{I_0(hkl)}\right]^{-1}$$

where I(hkl)=measured intensity (peak area) of the (hkl) reflection, $I_0$(hkl)=standard intensity according to ICDD's PDF-card No. 42-1489, n=number of reflections used in the calculation, (hkl) reflections used are: (111), (200), (220), (311), (331), (420), (422) and (511), and wherein a sum of TC(422) and TC(311) is less than or equal to 5.5.

One advantage with the fine-grained MTCVD Ti(C,N) layer of the present invention is that it enables a smooth surface as compared to a conventional MTCVD Ti(C,N) layer. Preferably the MTCVD Ti(C,N) layer of the present invention may have a smoothening effect, i.e. the outer surface of the MTCVD Ti(C,N) layer has a lower surface roughness $R_Z$ than the substrate surface. Another advantage with the MTCVD Ti(C,N) layer of the present invention is that the resistance to thermal cracks has been improved especially in milling applications. Another advantage with the cutting tool in accordance with the present invention is that the flaking resistance is improved in milling applications.

In one embodiment of the invention an average thicknesses of said columnar MTCVD Ti(C,N) layer is 2-7 μm, preferably 3-6 μm, most preferably 3-5 μm.

In one embodiment of the present invention the cutting tool further comprises an $Al_2O_3$ layer. The $Al_2O_3$ layer can be a κ-$Al_2O_3$ layer, an α-$Al_2O_3$ layer or a mixture thereof.

In one embodiment the cutting tool of the present invention comprises an α-$Al_2O_3$ layer that exhibits an X-ray diffraction pattern, wherein the texture coefficients TC(hkl) can be defined as $$TC(hkl) = \frac{I(hkl)}{I_0(hkl)}\left[\frac{1}{n}\sum_{n=1}^{n}\frac{I(hkl)}{I_0(hkl)}\right]^{-1}$$

where I(hkl)=measured intensity (peak area) of the (hkl) reflection, $I_0$(hkl)=standard intensity according to ICDD's PDF-card No. 10-0173, n=number of reflections used in the calculation.

In one embodiment of the present invention the TC(104) for the α-$Al_2O_3$ layer is >1.5, preferably >2, more preferably >3, most preferably >4, wherein the (hkl) reflections used are (104), (110), (113), (024), (116), (214), (300) and (0 0 12).

In one embodiment of the present invention the TC(110) for the α-$Al_2O_3$ layer is >1.5, preferably >2, more preferably >3, most preferably >4, wherein the (hkl) reflections used are (104), (110), (113), (024), (116), (214), (300) and (0 0 12).

In one embodiment of the present invention the TC(113) for the α-$Al_2O_3$ layer is >1.5, preferably >2, more preferably >3, most preferably >4, wherein the (hkl) reflections used are (104), (110), (113), (024), (116), (214), (300) and (0 0 12).

In one embodiment of the present invention the TC(024) for the α-$Al_2O_3$ layer is >1.5, preferably >2, more preferably >3, most preferably >4, wherein the (hkl) reflections used are (104), (110), (113), (024), (116), (214), (300) and (0 0 12).

In one embodiment of the present invention the TC(116) for the α-$Al_2O_3$ layer is >1.5, preferably >2, more preferably >3, most preferably >4, wherein the (hkl) reflections used are (104), (110), (113), (024), (116), (214), (300) and (0 0 12).

In one embodiment of the present invention the TC(0 0 12) for the α-$Al_2O_3$ layer is >1.5, preferably >2, more preferably >3, most preferably >4, wherein the (hkl) reflections used are (104), (110), (113), (024), (116), (214), (300) and (0 0 12).

In one preferred embodiment the sum of TC(104) and TC(0 0 12) for the α-$Al_2O_3$ layer is more than 4, preferably more than 5 and more preferably more than 6, wherein the (hkl) reflections used are (104), (110), (113), (024), (116), (214), (300) and (0 0 12).

In one embodiment of the invention an average thickness of said α-$Al_2O_3$ layer is 1-8 μm, preferably 2-6 μm, most preferably 3-5 μm.

In one embodiment of the present invention the coating further comprises one or more additional layers in-between and/or thereon such as a color layer deposited as an outermost layer.

In one embodiment of the invention the Ti(C,N) layer further comprises additional layers such as for example a TiN layer serving as a diffusion barrier deposited on the substrate prior to said MTCVD Ti(C,N) layer. Another example of an additional layer is one or more layers deposited on said MTCVD Ti(C,N) layer prior to deposition of said $Al_2O_3$ layer. These layers may for example provide improved adhesion of the outer layer.

In one embodiment of the invention the Ti(C,N) layer comprises an innermost TiN layer with a thickness enough to provide a diffusion barrier, preferably a thickness of 0.3 to 0.6 μm.

In one embodiment of the invention the coated cutting tool further comprises a Ti(C,N,O) layer, a Ti(C,O) layer, a Ti(Al)(C,N,O) layer or any combination thereof as a bonding layer between the MTCVD Ti(C,N) layer and the α-$Al_2O_3$ layer. The bonding layer is suitably 0.5-3 μm, preferably 0.5-2 μm thick.

In one embodiment of the invention the Ti(C,N) layer comprises a HTCVD Ti(C,N) layer deposited on the MTCVD Ti(C,N) layer.

In one embodiment of the invention the coating comprises a Ti(C,N) layer consisting of a sequence of layers in accordance with TiN/MTCVD Ti(C,N)/HTCVD Ti(C,N) deposited on the substrate. Preferably the thickness of the TiN layer is 0.3 μm to 0.6 μm. Preferably the thickness of the MTCVD Ti(C,N) layer is 2-7 μm, more preferably 3-5 μm, to provide sufficient resistance to abrasive flank wear. Preferably the thickness of the HTCVD Ti(C,N) layer is 0.2 μm to 0.5 μm. The columnar grains of the MTCVD Ti(C,N) layer are elongated with a length and a width and with a longitudinal axis along a growth direction of the MTCVD Ti(C,N) layer being perpendicular to a surface of the substrate. The grain width is not uniaxed but may differ in different directions. In addition the grains are generally not perfectly aligned with the growth direction. Hence the grain width is not easily measured. For the purpose of the present application, the width of the columnar grains is considered to extend in a direction parallel to the surface of the substrate, which is in a direction perpendicular to the growth direction of the MTCVD Ti(C,N) layer, and is measured in a scanning electron microscope (SEM) micrograph of a polished cross section of the MTCVD Ti(C,N) layer at a magnification of 15 000×. Grain boundaries are identified by differences in contrast between adjacent grains and grain widths are measured as the distance between the adjacent grain boundaries along a straight line as further explained in the following.

In the cutting tool according to the present invention, the MTCVD Ti(C,N) layer exhibits an X-ray diffraction pattern, wherein the texture coefficients TC(hkl) are calculated as defined above, but wherein I(hkl)=measured intensity (peak area) of the (hkl) reflection, $I_0$(hkl)=standard intensity according to ICDD's PDF-card No. 42-1489, n=number of reflections used in the calculation, (hkl) reflections used are: (111), (200), (220), (311), (331), (420), (422) and (511), and wherein a sum of TC(422) and TC(311) is less than or equal to 5.5, in one embodiment less than 5, in one embodiment less than 4.5 and in one embodiment less than 4. The sum of TC(422) and TC(311) can be more than 1 but less than or equal to 5.5, or more than 1.5 but less than 5, or more than 2 but less than 4.5, or more than 2.5 but less than 4. TC(311) is in one embodiment higher than TC(422).

In one embodiment of the present invention the MTCVD Ti(C,N) layer exhibits an X-ray diffraction pattern having the (422) reflection at a 2θ position of 123.15-123.25. The 2θ position of the (422) reflection relates to the carbon content in the coating such that a higher carbon content correlates to a lower 2θ position of the (422) reflection.

In one embodiment of the present invention a value of the full width at half max (FWHM) of the peak assigned to the (422) reflection of the MTCVD Ti(C,N) layer is 0.35-0.5, preferably 0.4-0.5, most preferably 0.42-0.46. The FWHM is related to the grain size such that a higher value of the FWHM correlates to smaller grains.

In one embodiment of the present invention, the cutting tool has been subjected to a brushing treatment of the cutting edge and/or a blasting treatment. This is advantageous in that the flaking resistance of the cutting edge is improved.

Thanks to the improved wear resistance of the MTCVD Ti(C,N) layer the toughness of the substrate can be increased at the expense of hardness. In one embodiment of the present invention the substrate is made of cemented carbide comprising WC grains in a binder phase comprising Co. Preferably the Co content is 5.5-10 wt-%, preferably 6-8 wt-%.

Although embodiments of the present invention have been described with Ti as the only metal element in the Ti(C,N) layer, Ti(C,N) layer or individual layers thereof in addition to Ti may comprise elements selected from one or more of Zr, Hf, V, Nb, Ta, Cr, Mo, W and Al in an amount not significantly altering the grain width or C/(C+N) ratio of the MTCVD Ti(C,N) layer. Moreover, the Ti(C,N) layer may also comprise B. Moreover, said MTCVD Ti(C,N) layer may comprise small amounts of oxygen without having significant effect on the properties of the MTCVD Ti(C,N) layer. In one embodiment of the invention the Ti(C,N) layer comprises one or more of these additional elements.

Although the $\alpha$-$Al_2O_3$ layer is described as a binary compound layer it should be appreciated that in alternative embodiments of the invention the $Al_2O_3$ layer may comprise one or more further elements such as for example Zr to form a ternary or a multinary compound such as (Al,Zr)O.

One advantage of the invention is that a small grain width in the MTCVD Ti(C,N) layer can be provided without having excessive amount of carbon in the process or in the coating layers formed.

Other objects, advantages and novel features of the invention will become apparent from the following detailed description of the invention when considered in conjunction with the accompanying drawings and claims.

BRIEF DESCRIPTION OF DRAWINGS

Embodiments of the invention will now be described with reference to the accompanying drawings, wherein.

DETAILED DESCRIPTION

Figure 2:
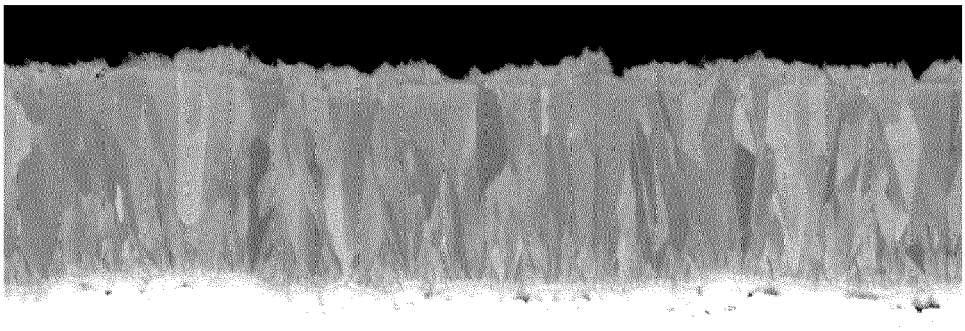
FIG. 2 is a cross sectional view of a Ti(C,N) coating representing prior art, made in accordance with Example 2.
Figure 3:
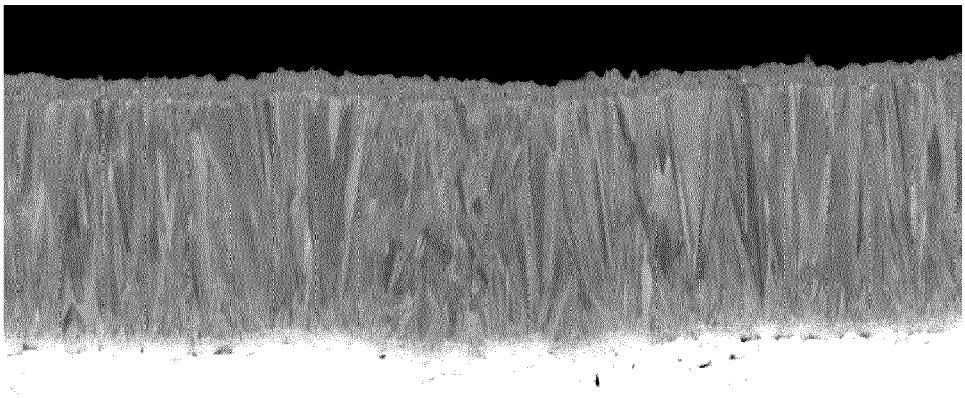
FIG. 3 is a cross sectional view of a Ti(C,N) coating in accordance with one embodiment of the present invention made in accordance with Example 3.

Coated cutting tools in accordance with embodiments of the present invention were manufactured as disclosed in Example 1 and Example 3, comprising a here called "fine-grained" MTCVD Ti(C,N) and an $\alpha$-$Al_2O_3$ layer. These coated cutting tools were compared to coated cutting tools made in accordance with prior art, Example 2, comprising coarser grained MTCVD Ti(C,N) and an $\alpha$-$Al_2O_3$ layer corresponding to the $\alpha$-$Al_2O_3$ layer in Example 3. Cross sectional views of the Ti(C,N layer as deposited in accordance with Example 3 are shown in FIG. 3 and in accordance with Example 2 shown in FIG. 2.

The comparing is based on performance tests as disclosed in Example 4 and Example 5. The coating deposition parameters are shown in Table 1 and Table 2, the as measured coating thicknesses in Table 3, the texture coefficients of the Ti(C,N) layer are disclosed in Table 4 and the texture coefficients of the $\alpha$-$Al_2O_3$ layer are disclosed in Table 5.

EXAMPLE 1

Invention

Coated cutting tools in accordance with one embodiment of the invention were manufactured. First, cemented carbide R365-1505ZNE-KM substrates were manufactured. The substrates were then coated in a deposition process as disclosed in Table 1.

Substrates with a composition of 7.61 wt % Co, 1.15 wt % Ta, 0.27 wt % Nb and balance WC, a Hc value of 14.5 kA/m (measured using a Foerster Koerzimat CS1.096 according to DIN IEC 60404-7) and a hardness HV3 of 1550 GPa were manufactured by pressing powder and sintering the pressed bodies. Prior to deposition the substrates were edge rounded to about 35 μm by wet blasting. A coating consisting of first a Ti(C,N) layer with a total thickness of about 4.8 μm, which consists of the layer sequence 0.3 μm TiN, 4.1 μm MTCVD Ti(C,N) and 0.4 μm HTCVD Ti(C,N), then a 0.8 μm bonding layer of Ti(C,N,O), and an $\alpha$-$Al_2O_3$ layer with a thickness of 3.7 um and finally a 1.2 μm thick color layer of TiN/TiC/TiN/TiC/TiN was deposited by CVD on the substrates. The coating was deposited in a CVD reactor having radial gas flow using deposition conditions for growth of the layers as described in Table 1.

After the deposition the coated cutting tools some of the tools were subjected to blasting and some were subjected to edge line brushing prior to the performance testing. In the following samples called Sample 1A were subjected to wet blasting to remove the color layers on the rake faces, and coated cutting tools called Sample 1B were subjected to edge line brushing to homogenize the coating on the edge line.

Figure 1:
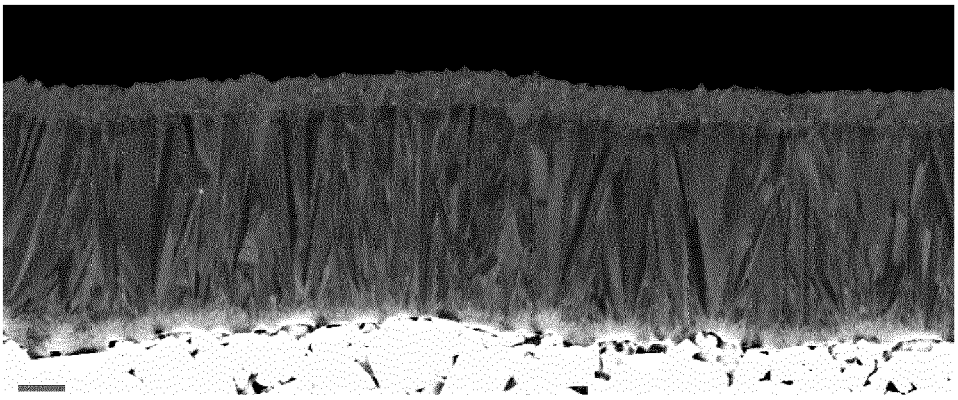
FIG. 1 is a cross-sectional view of a coating in accordance with one embodiment of the invention, made in accordance with Example 1.

FIG. 1 shows a cross-sectional SEM image of the coating and the outermost part of the substrate on the rake face of one of the coated cutting tools at a magnification of 15 000×. The MTCVD Ti(C,N) layer has a columnar structure with fine columnar grains. In order to evaluate the grain size of the MTCVD Ti(C,N) layer the grain width was measured in the SEM and further explained below. The average grain width was 140 nm.

Texture coefficients TC (hkl) of the columnar grains of the MTCVD Ti(C,N) layer, see Table 4, and the $\alpha$-$Al_2O_3$ layer, see Table 5, were determined by X-ray diffraction, as explained in detail below. The MTCVD Ti(C,N) shows a sum of TC(311) and TC(422) that is 3.92. The X-Ray-diffraction measurement of the $\alpha$-$Al_2O_3$ layer shows that the sum of TC(0 0 12) and TC(104) is 5.98.

The MTCVD Ti(C,N) layer exhibits an X-ray diffraction pattern having the peak of the (422) reflection at $2\theta=123.3°$, which has been determined as explained in the following. This peak position corresponds to a C/(C+N) ratio in the MTCVD Ti(C,N) layer of 0.55. A second method used to determine the carbon content by X-Ray diffraction is by using Rietveld refinement. The result from this approach is the same as the result from peak position. The FWHM of the peak of the (422) reflection is 0.37°.

EXAMPLE 2

Prior Art

Coated cutting tools representing prior art were manufactured to serve as references. The deposition conditions for growth of the coatings are described in Table 2. A cross sectional view of the deposited Ti(C,N) is shown in FIG. 2.

First, cemented carbide R365-1505ZNE-KM substrates with the same composition as disclosed in Example 1 above were manufactured. Prior to coating deposition the substrates were edge rounded to about 35 μm by wet blasting. A coating consisting of the layer sequence 0.3 μm TiN, 4.7 μm MTCVD Ti(C,N), 0.4 μm HTCVD Ti(C,N), 0.6 μm bonding layer comprising Ti(C,O), an $\alpha$-$Al_2O_3$ layer with a thickness of about 3.4 μm and a 1.4 μm TiN/TiC/TiN/TiC/TiN color layer was deposited by CVD on the substrates.

After deposition the coated cutting tools called Sample 2A were subjected to wet blasting to remove the color layer on the rake faces, and coated cutting tools called Sample 2B were subjected to edge line brushing to homogenize the coating on the edge line.

Texture coefficients TC (hkl) of the columnar grains of the MTCVD Ti(C,N) layer, see Table 4, and the $\alpha$-$Al_2O_3$ layer, see Table 5, were determined by X-ray diffraction, as explained in detail below. The MTCVD Ti(C,N) has a sum of TC(311) and TC(422) that is 3.85. The X-Ray-diffraction measurement of the $\alpha$-$Al_2O_3$ layer shows that the sum of TC(0 0 12) and TC(104) is 2.6.

The MTCVD Ti(C,N) layer exhibits an X-ray diffraction pattern having the peak of the (422) reflection at $2\theta=123.47°$, which has been determined as explained in the following. This peak position corresponds to a C/(C+N) ratio in the MTCVD Ti(C,N) layer of 0.52. The FWHM of the peak of the (422) reflection is 0.27°.

EXAMPLE 3

Invention

Coated cutting tools were manufactured in accordance with Example 1 with the corresponding MTCVD Ti(C,N) layer but with a bonding layer, an $\alpha$-$Al_2O_3$ layer and a color layer corresponding to Example 2, as shown in Table 1 and 2. A cross sectional view of the deposited Ti(C,N) is shown in FIG. 3.

Texture coefficients TC (hkl) of the columnar grains of the MTCVD Ti(C,N) layer, see Table 4, and the $\alpha$-$Al_2O_3$ layer, see Table 5, were determined by X-ray diffraction, as explained in detail below. The MTCVD Ti(C,N) has a sum of TC(311) and TC(422) that is 3.84. The X-Ray-diffraction measurement of the $\alpha$-$Al_2O_3$ layer shows that the sum of TC(0 0 12) and TC(104) is 2.17.

After deposition the coated cutting tools called Sample 3A were subjected to wet blasting to remove the color layer on the rake faces, and coated cutting tools Sample 3B were subjected to edge line brushing to homogenize the coating on the edge line.

TABLE 1

| | TiN | MTCVD Ti(C, N) | HTCVD Ti(C, N) | HTCVD Ti(C, N) | $\alpha$-$Al_2O_3$ | Color layer TiN/TiC/TiN/TiC/TiN Ex. 1 | |
|---|---|---|---|---|---|---|---|
| Precursors | Ex. 1, 3 Vol-% | Ex. 1, 3 Vol-% | Ex. 1 Vol-% | Ex. 3 Vol-% | Ex. 1 Vol-% | TiN Vol-% | TiC Vol-% |
| $H_2$ | 60.20 | 96.60 | 67.89 | 76.93 | 90.70 | 49.14 | 93.29 |
| $N_2$ | 38.30 | — | 25.46 | 15.38 | — | 49.14 | — |
| $CH_4$ | — | — | 3.39 | 5.13 | — | — | 4.19 |
| HCl | — | — | 1.70 | — | 2.91 | — | — |
| CO | — | — | — | — | — | — | — |
| $TiCl_4$ | 1.50 | 2.95 | 1.56 | 2.56 | — | 1.72 | 2.52 |
| $CH_3CN$ | — | 0.45 | — | — | — | — | — |
| $CO_2$ | — | — | — | — | 4.65 | — | — |
| $H_2S$ | — | — | — | — | 0.58 | — | — |
| $AlCl_3$ | — | — | — | — | 1.16 | — | — |
| Temperature (° C.) | 930 | 830 | 1000 | 1010 | 1000 | 1000 | 1000 |
| Pressure (mbar) | 160 | 80 | 400 | 55 | 55 | atm | atm |
| Ti/CN ratio | — | 6.6 | — | — | — | — | — |

TABLE 2

| Precursors | TiN Ex. 2 Vol-% | MTCVD Ti(C, N) Ex. 2 Vol-% | HTCVD Ti(C, N) Ex. 2 Vol-% | $\alpha$-$Al_2O_3$ Ex. 2, 3 Vol-% | Color layer TiN/TiC/TiN/TiC/TiN Ex. 2, 3 TiN Vol-% | TiC Vol-% |
|---|---|---|---|---|---|---|
| $H_2$ | 60.20 | 82.25 | 76.93 | 82.97 | 49.14 | 93.29 |
| $N_2$ | 38.30 | 7.83 | 15.38 | | 49.14 | — |
| $CH_4$ | — | — | 5.13 | | — | 4.19 |
| HCl | — | 7.83 | — | 5.49 | — | — |
| CO | — | — | — | | — | — |
| $TiCl_4$ | 1.50 | 1.44 | 2.56 | | 1.72 | 2.52 |
| $CH_3CN$ | — | 0.65 | — | | — | — |
| $CO_2$ | — | — | — | 8.79 | — | — |
| $H_2S$ | — | — | — | 0.55 | — | — |
| $AlCl_3$ | — | — | — | 2.20 | — | — |
| Temperature (° C.) | 930 | 885 | 1010 | 1010 | 1010 | 1010 |
| Pressure (mbar) | 160 | 55 | 55 | 55 | atm | atm |
| Ti/CN ratio | — | 2.2 | — | — | — | — |

TABLE 3

| Coating thickness | TiN | MT CVD Ti(C, N) | HT CVD Ti(C, N) | Bonding layer | $\alpha$-$Al_2O_3$ | Decorative layer | Total |
|---|---|---|---|---|---|---|---|
| Ex. 1 | 0.3 | 4.1 | 0.4 | 0.8 | 3.7 | 1.2 | 10.5 |
| Ex. 2 | 0.3 | 4.7 | 0.4 | 0.6 | 3.4 | 1.4 | 10.8 |
| Ex. 3 | 0.3 | 5.3 | 0.4 | 0.6 | 3.3 | 1.3 | 11.2 |

TABLE 4

| MTCVD Ti(C, N) | TC(111) | TC(200) | TC(220) | TC(311) | TC(331) | TC(420) | TC(422) | TC(511) | TC(311) + TC(422) |
|---|---|---|---|---|---|---|---|---|---|
| Ex. 1 | 1.53 | 0.24 | 0.64 | 3.08 | 0.51 | 0.72 | 0.84 | 0.44 | 3.92 |
| Ex. 2 | 0.87 | 0.15 | 1.21 | 2.32 | 0.83 | 0.72 | 1.53 | 0.37 | 3.85 |
| Ex. 3 | 1.19 | 0 | 0.71 | 1.97 | 1.15 | 0.60 | 1.87 | 0.51 | 3.84 |

TABLE 5

| $\alpha$-$Al_2O_3$ | TC(104) | TC(110) | TC(113) | TC(024) | TC(116) | TC(214) | TC(300) | TC(0 0 12) | TC(104) + TC(0 0 12) |
|---|---|---|---|---|---|---|---|---|---|
| Ex. 1 | 3.84 | 0.32 | 0.24 | 0.39 | 1.08 | 0 | 0 | 2.14 | 5.98 |
| Ex. 2 | 2.60 | 1.08 | 0.97 | 0.83 | 1.24 | 0.72 | 0.55 | 0 | 2.6 |
| Ex. 3 | 2.17 | 0.80 | 1.11 | 1.35 | 1.68 | 0.51 | 0.38 | 0 | 2.17 |

EXAMPLE 4

Flaking Test

Coated cutting tools of Example 1, 2 and 3 were tested in face milling of a 120 mm wide component of nodular cast iron SS0727, without coolant under the following conditions.

| | |
|---|---|
| Cutting speed, $V_c$ | 300 m/min |
| Feed, $f_z$ | 0.3 mm/rev |
| Depth of cut, $a_p$ | 3 mm |
| No. of teeth | 1 |
| Diameter of cutter | 160 mm |
| Width of cut for milling, $a_e$ | 120 mm |

One pass of the test piece was cut and thereafter the wear of the cutting edge of each tool was studied in a light optical microscope. The intermittent dry cutting of nodular cast iron is a demanding cutting operation and flaking often limit the tool life.

Figure 4:
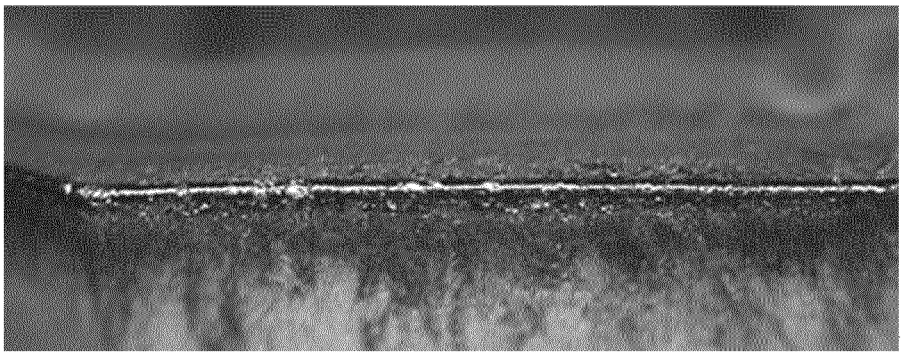
FIG. 4 is a LOM image of the edge line of a cutting tool (Sample 1A) in accordance with one embodiment of the invention tested in accordance with Example 4.
Figure 5:
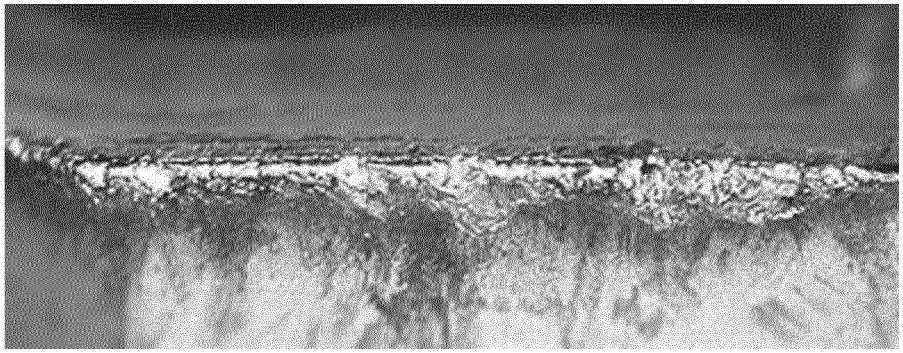
FIG. 5 is a LOM image of the edge line of a cutting tool (Sample 2A) in accordance with prior art tested in accordance with Example 4.
Figure 6:
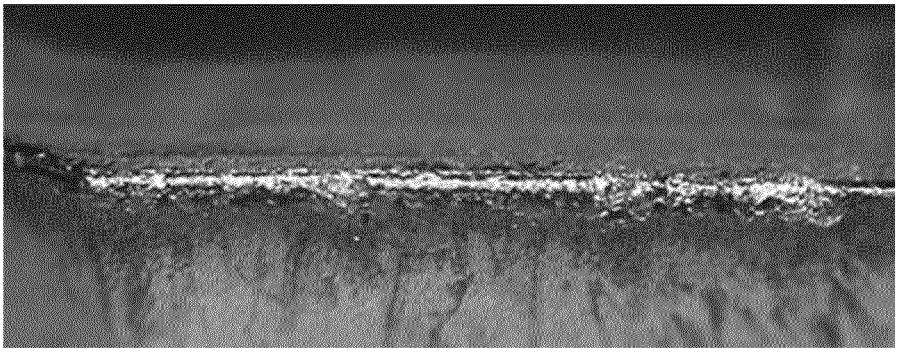
FIG. 6 is a LOM image of the edge line of a cutting tool (Sample 3A) in accordance with one embodiment of the invention tested in accordance with Example 4.

The Samples 1A that had been subjected to blasting showed the best flaking resistance, better than the Samples 2A and 3A. And correspondingly the Sample 1B that had been subjected to brushing of the edge line showed a better flaking resistance than the Samples 2B and 3B. The blasted samples showed an increased resistance to flaking as compared to the edge line brushed samples 1B-3B. SEM images of tested cutting tools are shown in FIG. 4-6, wherein Sample 1A is shown in FIG. 4, sample 2A is shown in FIG. 5 and sample 3A is shown in FIG. 6.

EXAMPLE 5

Thermal Cracks

Coated cutting tools of Example 1, 2 and 3 were tested in face milling of a 120 mm wide component of grey cast iron (SS0125) with coolant

| | |
|---|---|
| Cutting speed, $V_c$ | 220 m/min |
| Feed, $f_z$ | 0.25 mm/rev |
| Depth of cut, $a_p$ | 3 mm |
| No. of teeth | 1 |
| Diameter of cutter | 160 mm |
| Width of cut for milling, $a_e$ | 60 + 60 mm |

The cutter is placed centrally in the $2^{nd}$ cut

Six passes were run with the same cutting edge of each tool. The cutting tools are subjected to a high degree of thermal cycling in this test due to the intermittent machining and use of coolant, which can cause thermal cracks extending across the cutting edge. As a consequence of formed thermal cracks, also called comb cracks, the edge might eventually suffer from chipping whereby portions of the coating and the substrate spall off.

Figure 7:
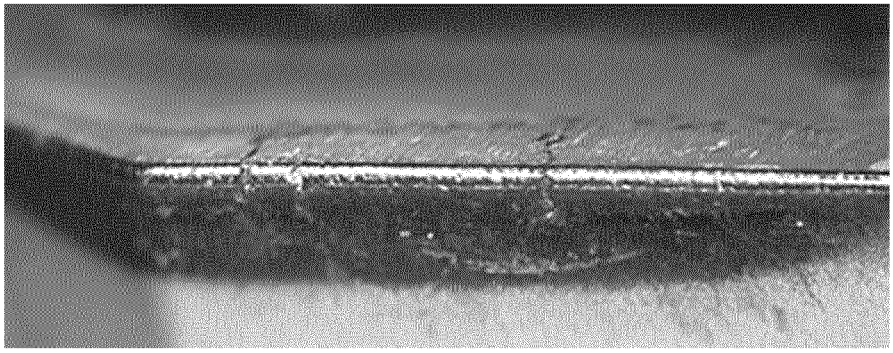
FIG. 7 is a LOM image of the edge line of a cutting tool (Sample 1A) in accordance with one embodiment of the invention tested in accordance with Example 5.
Figure 8:
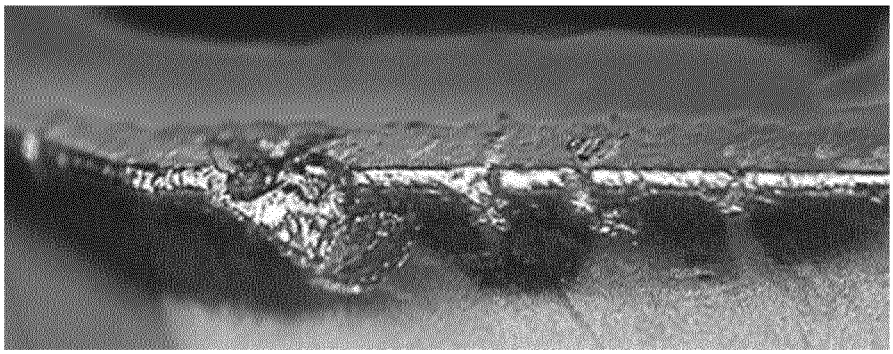
FIG. 8 is a LOM image of the edge line of a cutting tool (Sample 2A) in accordance with prior art tested in accordance with Example 5.
Figure 9:
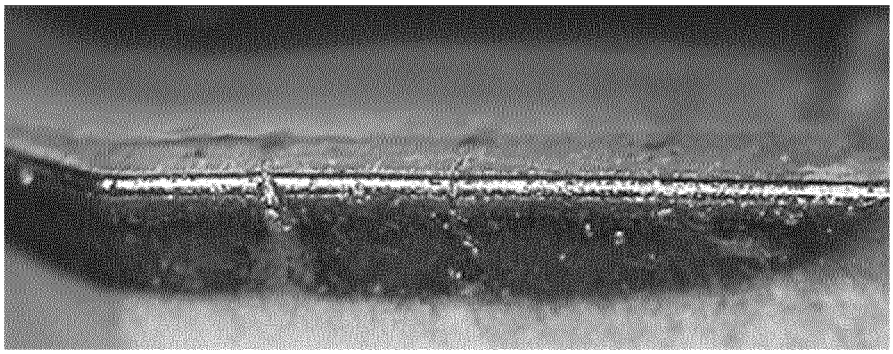
FIG. 9 is a LOM image of the edge line of a cutting tool (Sample 3A) in accordance with one embodiment of the invention tested in accordance with Example 5.

FIG. 7-9 shows light optical microscope (LOM) images of the edge line of the cutting tools after the test of Example 5 of Samples 1A, 2A and 3A, respectively.

The coated cutting tools in accordance with Samples 2A and 2B suffered from flaking, while all the cutting tools of Sample 1A, 1B, 3A and 3B developed fewer and smaller cracks. Since the cutting tools made in accordance with Example 1 (Sample 1A, 1B) and Example 3 (Sample 3A, 3B) comprises the corresponding MTCVD Ti(C,N) layer representing embodiments of the present invention, while the cutting tools of Example 2 comprises an MTCVD Ti(C,N) representing prior art, a resistance to thermal crack formation in the present test is considered to be related to the properties of the MTCVD Ti(C,N) layer in accordance with the present invention.

For the purpose of the present application, and in particular for the above examples, methods for determining properties of the coatings are defined in the following.

In order to evaluate the thicknesses and grain size of individual layers of the coating the coated cutting tool is cut, ground and polished to obtain a polished cross section with a surface normal perpendicular to a surface normal of the substrate on the rake face of the coated cutting tool.

The layer thicknesses are measured using a light optical microscope (LOM).

In order to enable grain width measurement it is necessary to obtain a smooth surface that gives sufficient contrast between grains of different orientation in the MTCVD Ti(C,N) layer by electron channelling. Thus for the purpose of grain width measurement the polishing of the cross section comprises the steps of:

- rough polishing on paper using an oil-based diamond suspension (from Microdiamant AG) with an average diamond particle size of 9 μm and 0.7 g of diamond particles per 2 dl oil (Mobil Velocite no. 3),
- fine polishing on paper using an oil-based diamond suspension (from Microdiamant AG) with an average diamond particle size of 1 μm and 0.7 g of diamond particles per 2 dl oil (Mobil Velocite no. 3), and
- oxide polishing using a soft cloth and under dripping of a suspension comprising a mixture of $SiO_2$ (10-30%) and $Al_2O_3$ particles (1-20%) with average particle size of 0.06 μm (Masterpolish 2, Buehler) at 150 rev/min and pressure 35 N for 220 s.

The grain width was measured from a SEM micrograph of the polished cross section at a magnification of 15 000× in the SEM obtained at 5.0 kV and working distance 5 mm. The grain boundaries are identified by differences in contrast between adjacent grains and grain widths are measured as the distance between the identified adjacent grain boundaries along a 10 μm straight line in a direction parallel to a surface of the substrate, at a centered position between a lowermost and an uppermost interfacial surface of the MTCVD Ti(C,N) layer. Grain widths smaller than 20 nm are not readily identified in the SEM image and are not considered.

The columnar MTCVD Ti(C,N) layer comprises twinned columnar grains and may comprise even other intergranular defects or dislocations, which are not intended to be counted as grain boundaries in this method. Twin boundaries may be identified and excluded since the symmetry and orientation of the twin grains may not generate any substantial difference in contrast when passing the twin boundaries. Hence, the twinned columnar grain is intended to be treated as one grain when determining the grain width.

In order to investigate the texture coefficients of the MTCVD Ti(C,N) layer X-Ray diffraction is conducted on the flank face using a PANalytical CubiX$^3$ diffractometer equipped with a PIXcel detector. The coated cutting tools are mounted in sample holders that ensure that the flank face of the samples are parallel to the reference surface of the sample holder and also that the flank face is at appropriate height. Cu-$K_\alpha$ X-rays are used for the measurements, with a voltage of 45 kV and a current of 40 mA. Anti-scatter and slits of ½ degree and divergence slit of ¼ degree are used. The diffracted intensity from the coated cutting tool is measured around 2θ angles were TiCN peaks occur, ranging from approximately 20° to 140°, i.e. over an incident angle θ range from 10 to 70°.

Data analysis, including background subtraction and Cu-$K_\alpha$ stripping, is performed using PANalytical's X'Pert HighScore software, and integrated peak areas emanating from this are used to calculate the texture coefficients TC (hkl) of the MTCVD Ti(C,N) layer using X'Pert Industry software by comparing the ratio of the measured intensity data to standard intensity data according to $$TC(hkl) = \frac{I(hkl)}{I_0(hkl)}\left[\frac{1}{n}\sum_{n=1}^{n}\frac{I(hkl)}{I_0(hkl)}\right]^{-1}$$

where I(hkl)=measured area intensity of the (hkl) reflection, $I_0$(hkl)=standard intensity according to ICDD's PDF-card no 42-1489, n=number of reflections used in the calculation, (hkl) reflections used are: (111), (200), (220), (311), (331), (420), (422) and (511).

Since the MTCVD Ti(C,N) layer is a finitely thick film the relative intensities of a pair of peaks of the same compound are different than they are for bulk samples, due to the differences in path length through the Ti(C,N) layer. Therefore, thin film correction is applied to the integrated peak area intensities, taken into account also the linear absorption coefficient of Ti(C,N), when calculating the TC values. Since the substrates used in the examples were WC a further correction is applied to correct for the overlap of the TiCN (311) by the WC (111) peak. This is made by deducting 25% of the area intensity of another WC peak, namely WC(101) from the TiCN (311) area intensity. Since possible further layers above the MTCVD Ti(C,N) layer will affect the X-ray intensities entering the MTCVD Ti(C,N) layer and exiting the whole coating, corrections need to be made for these as well, taken into account the linear absorption coefficient for the respective compound in a layer.

In order to estimate the carbon content the diffraction angle 2θ of the (422) reflection in the X-ray diffraction pattern obtained using Cu$K_\alpha$ radiation is determined. The position of the (422) reflection relates to the carbon content in the coating such that a higher carbon content correlates to a lower angle of the (422) reflection. The C/N ratio, in the interval from $TiC_0N_1$ to $TiC_1N_0$, shows a linear dependence to the diffraction angle 2θ, making it possible to extract information about the C/N ratio by measuring the position of the (422) reflection.

A second method used to determine the carbon content is by using Rietveld refinement to the complete diffraction pattern collected as discussed above. From the refinement it is possible to extract data on lattice parameters for the TiCN phase. The lattice parameter also varies linearly with the C/N ratio as discussed above. The result from this approach correlates well with the results where the diffraction angle was the parameter used to probe the carbon content.

The (422) reflection is also used to estimate the grain width. This is accomplished by determining the FWHM of the peak in the diffractogram. The FWHM is related to the grain size such that a higher value of the width correlates to smaller grains.

Elemental analysis is performed by electron microprobe analysis using a JEOL electron microprobe JXA-8900R equipped with wavelength dispersive spectrometers (WDS) in order to determine the C/(C+N) ratio of the MTCVD Ti(C,N) layer. The analysis of the MTCVD Ti(C,N) layer average composition is conducted on a polished cross section on the flank face within the MTCVD Ti(C,N) layer in 10 points with spacing of 50 μm along a straight line in a direction parallel to a surface of the substrate, at a centered position between a lowermost and an uppermost interfacial surface of the MTCVD Ti(C,N) layer using 10 kV, 29 nA, a TiCN standard, and with corrections for atomic number, absorption and fluorescence. In Example 1 the points were placed within the MTCVD Ti(C,N) coating at a distance of 2-3 μm from the interface between the substrate and the MTCVD Ti(C,N) layer.

In order to investigate the texture coefficients of the $\alpha$-$Al_2O_3$ layer X-Ray diffraction is conducted on the flank face. The testing is performed on a PANalytical CubiX$^3$ diffractometer equipped with a PIXcel detector. The samples are mounted in sample holders that ensure that a flat face, for example a flat flank face, of the samples are parallel to the reference surface of the sample holder and also that the sample surface is at the correct height. Cu-$K_\alpha$ X-rays are used for the measurements, with a voltage of 45 kV and a current of 40 mA. The irradiated area of the sample is selected to avoid a spill-over of the X-ray beam over the coated face of the sample. On the primary side a fixed anti-scatter slit of ½ degree and a fixed divergence slit of ¼ degree is used. On both incident and diffracted beam path soller slits of 0.04 rad are mounted. The diffracted intensity from the sample is measured around 2θ angles where alpha $Al_2O_3$ peaks occur, ranging from approximately 20 to 140° (that is to say over an incident angle θ range from 10 to 70°) and collected and stored by the computer attached to the diffractometer after measurement. The data collection software is PANalytical's X'Pert Industry and this software is able to internally communicate with the analysis software X'Pert HighScore.

In order to investigate the texture of the alpha $Al_2O_3$ layer X-Ray diffraction is conducted using Cu$K_\alpha$ radiation and texture coefficients TC (hkl) for different growth directions of the columnar grains of the alpha $Al_2O_3$ layer are calculated according to $$TC(hkl) = \frac{I(hkl)}{I_0(hkl)}\left[\frac{1}{n}\sum_{n=1}^{n}\frac{I(hkl)}{I_0(hkl)}\right]^{-1}$$

where I(hkl)=measured (peak integrated area) intensity of the (hkl) reflection, $I_0$(hkl)=standard intensity according to ICDD's PDF-card no 10-0173, n=number of reflections to be used in the calculation. In this case the (hkl) reflections used are: (104), (110), (113), (024), (116), (214), (300) and (0 0 12).

The data analysis, including background subtraction and Cu-$K_\alpha$ stripping, is done using PANalytical's X'Pert HighScore software. The output from this program are then used to calculate the texture coefficients of the alpha $Al_2O_3$ in the X'Pert Industry software by comparing the ratio of the measured intensity data to the standard intensity data (ICDD's PDF-card no 10-0173), using Eq. 1. Since the alpha $Al_2O_3$ layer is a finitely thick film the relative intensities of a pair of peaks at different 2θ angles are different than they are for bulk samples, due to the differences in path length through the alpha $Al_2O_3$ layer. Therefore, thin film correction is applied to the integrated peak area intensities, taken into account also the linear absorption coefficient of alpha $Al_2O_3$, when calculating the TC values. Since possible further layers above the alpha $Al_2O_3$ layer will affect the X-ray intensities entering the alpha $Al_2O_3$ layer and exiting the whole coating, corrections need to be made for these as well, taken into account the linear absorption coefficient for the respective compound in a layer. Alternatively, a further layer such as TiN above an alumina layer can be removed by a method that does not substantially influence the XRD measurement results, e.g. etching.

While the invention has been described in connection with various exemplary embodiments, it is to be understood that the invention is not to be limited to the disclosed exemplary embodiments, on the contrary, it is intended to cover various modifications and equivalent arrangements within the appended claims.

The invention claimed is:

1. A coated cutting tool comprising: a substrate;

a surface coating disposed on the substrate, wherein said coating includes a Ti(C,N) layer comprising at least one columnar MTCVD Ti(C,N) layer with an average grain width of 0.05-0.5μm, measured on a cross section with a surface normal perpendicular to a surface normal of the substrate, on a rake face of said coated cutting tool, along a straight line in a direction parallel to a surface of the substrate, at a centered position between a lowermost and an uppermost interface of said columnar MTCVD Ti(C,N) layer, an atomic ratio of carbon to the sum of carbon and nitrogen (C/(C+N)) contained in said MTCVD Ti(C,N) layer is in average 0.50-0.65, wherein said MTCVD Ti(C,N) layer exhibits an X-ray diffraction pattern, as measured using CuKα radiation, wherein the texture coefficients TC(hkl) are defined as $$TC(hkl) = \frac{I(hkl)}{I_0(hkl)}\left[\frac{1}{n}\sum_{n=1}^{n}\frac{I(hkl)}{I_0(hkl)}\right]^{-1}$$

where I(hkl) =measured intensity (peak area) of the (hkl) reflection, $I_0$(hkl)=standard intensity according to ICDD's PDF-card No. 42-1489, n=number of reflections used in the calculation, (hkl) reflections used are: (111),(200),(220),(311),(331),(420),(422)and (511), and a sum of TC(422) and TC(311) is less than or equal to 5.5; and an $Al_2O_3$ layer deposited above said [Ti(C,N,O)] *Ti(C, N)* layer.

2. The coated cutting tool according to claim 1, wherein the average grain width is 0.1-0.2μm.

3. The coated cutting tool according to claim 1, wherein the C/(C+N) ratio is 0.54-0.56.

4. The coated cutting tool according to claim 1, wherein an average thicknesses of said columnar MTCVD Ti(C,N) layer is 2-7μm.

5. The coated cutting tool according to claim 4, wherein said $Al_2O_3$ layer is an α-$Al_2O_3$ layer that exhibits an X-ray diffraction pattern, as measured using CuKαradiation, wherein the texture coefficients TC(hkl) are defined as $$TC(hkl) = \frac{I(hkl)}{I_0(hkl)}\left[\frac{1}{n}\sum_{n=1}^{n}\frac{I(hkl)}{I_0(hkl)}\right]^{-1}$$

where I(hkl) =measured intensity (peak area) of the (hkl) reflection $I_0$(hkl)=standard intensity according to ICDD's PDF-card No. 10-0173 n=number of reflections used in the calculation.

6. The coated cutting tool according to claim 5, wherein the TC(104) for the α-$Al_2O_3$ layer is higher than 1.5, when the (hkl) reflections used are (104), (110), (113), (024), (116), (214), (300) and (0 0 12).

7. The coated cutting tool according to claim 5, wherein the TC(110) for the α-$Al_2O_3$ layer is higher than 1.5, when the (hkl) reflections used are (104), (110), (113), (024), (116), (214), (300) and (0 0 12).

8. The coated cutting tool according to claim 5, wherein the TC(024) for the α-$Al_2O_3$layer is higher than 1.5, when the (hkl) reflections used are (104), (110), (113), (024), (116), (214), (300) and (0 0 12).

9. The coated cutting tool according to claim 5, wherein the TC(116) for the α-$Al_2O_3$ layer is higher than 1.5, when the (hkl) reflections used are (104), (110), (113), (024), (116), (214), (300) and (0 0 12).

10. The coated cutting tool according to claim 5, wherein the TC(0 0 12) for the α-$Al_2O_3$ layer is higher than 1.5, when the (hkl) reflections used are (104), (110), (113), (024), (116), (214), (300) and (0 0 12).

11. The coated cutting tool according to claim 5, wherein the sum of TC(104) and TC(0 0 12) for the α-$Al_2O_3$ layer is higher than 4, when the (hkl) reflections used are (104), (110), (113), (024), (116), (214), (300) and (0 0 12).

12. The coated cutting tool according to claim 1, wherein the $Al_2O_3$ layer has an average thickness of 1-8μm.

13. The coated cutting tool according to claim 1, wherein the insert has been subjected to a brushing treatment of the cutting edge and/or a blasting treatment.

14. The coated cutting tool according to claim 1, wherein an average thicknesses of said columnar MTCVD Ti(C,N) layer is 3-5μm.

15. The coated cutting tool according to claim 1, wherein the $Al_2O_3$ layer has an average thickness of 2-6μm.

16. The coated cutting tool according to claim 1, wherein the $Al_2O_3$ layer has an average thickness of 3-4μm.

* * * * *